(12) United States Patent
Mannes Hillesheim et al.

(10) Patent No.: US 11,316,519 B2
(45) Date of Patent: Apr. 26, 2022

(54) DISTRIBUTED INTERLEAVING CONTROL OF MULTIPHASE SMPCS

(71) Applicants: INSTITUT NATIONAL POLYTECHNIQUE DE TOULOUSE, Toulouse (FR); NXP USA, Inc., Austin, TX (US)

(72) Inventors: Miguel Mannes Hillesheim, Toulouse (FR); Marc Michel Cousineau, Lavaur (FR); Eric Pierre Rolland, Grepiac (FR); Philippe Goyhenetche, Fonsorbes (FR); Guillaume Jacques Léon Aulagnier, Toulouse (FR)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/109,877

(22) Filed: Dec. 2, 2020

(65) Prior Publication Data

US 2021/0167780 A1 Jun. 3, 2021

(30) Foreign Application Priority Data

Dec. 3, 2019 (EP) .................................... 19306559

(51) Int. Cl.
*H03K 19/00* (2006.01)
*G06F 1/08* (2006.01)
(Continued)

(52) U.S. Cl.
CPC .......... *H03K 19/0016* (2013.01); *G06F 1/08* (2013.01); *H03K 3/012* (2013.01); *H03K 5/131* (2013.01); *H03K 19/21* (2013.01)

(58) Field of Classification Search
None
See application file for complete search history.

(56) References Cited

U.S. PATENT DOCUMENTS 7,394,232 B2 7/2008 Hendrix et al.
8,120,203 B2 2/2012 Heineman et al.
(Continued)

FOREIGN PATENT DOCUMENTS

CN 110445380 A 11/2019
JP 2000-312442 A1 11/2000
WO 2017/205098 A1 11/2017

OTHER PUBLICATIONS

Cousineau, Marc et al; "Triangular Carrier Self-Alignment Using Modular Approach for Interleaved Converter Control"; Proceedings of the 2011 14th European Conference on Power Electronics and Applications; Birmingham, UK, 10 pages (Sep. 15, 2011).
(Continued)

*Primary Examiner* — Cassandra F Cox

(57) ABSTRACT

A controller for a switched mode power converter (SMPC) module for use in a multiphase SCMP is disclosed, comprising: a signal generator, configured to generate a periodic signal and a clock, both having a frequency and a signal phase, and for controlling the switched mode power converter module; a first-clock and second-clock inputs configured to receive respective first-clock and second-clock signal having the frequency and respective first and second phases from neighbouring controllers; and wherein the signal generator comprises a phase adjustment circuit configured to adjust the phase of the periodic signal so as to be equidistant from the first and second phase, wherein the phase adjustment circuit determines an error signal in dependence on an offset between the phase and a mid-point between the first phase and the second phase, and a feedback circuit configured to adjust the phase in dependence on the error signal.

17 Claims, 5 Drawing Sheets

(51) Int. Cl.
*H03K 3/012* (2006.01)
*H03K 5/131* (2014.01)
*H03K 19/21* (2006.01)

(56) References Cited

U.S. PATENT DOCUMENTS

| | | | |
|---|---|---|---|
| 2004/0123167 A1 | 6/2004 | Chapuis | |
| 2010/0201405 A1 | 8/2010 | Ahmad et al. | |
| 2011/0169471 A1 | 7/2011 | Nagasawa | |
| 2015/0326021 A1 | 11/2015 | Cousineau | |
| 2018/0123443 A1* | 5/2018 | Sreenivas | H02M 1/14 |
| 2021/0167780 A1 | 6/2021 | Mannes Hillesheim et al. | |

OTHER PUBLICATIONS

Garcia, O. et al; "Effect of the Tolerances in Multi-Phase DC-DC Converters; IEEE 36th Power Electronics Specialists Conference; IEEE; 6 pages (2005).

Gateau, G. et al; "Digital Implementation of Decentralized Control for Multilevel Converter"; IEEE Xplore; 6 pages (Sep. 11, 2017).

Hegarty, Timothy; "Current-Mode Control Stability Analysis For DC-DC Converters (Part 1)"; How2Power Today; 7 pages (Jun. 2014).

International Rectifier; "IR3081PBF Datasheet"; retreived from the Internet http://www.irf.com/product-info/datasheets/data/ir3081pbf.pdf; 40 pages Nov. 30, 2020.

Rajini, K.R. et al; "Design and Implementation of Runtime Reconfigurable High Resolution Digital Pulse Width Modulator on FPGA"; Int'l J. of Innovative Research in Science, Engineering and Technology, vol. 3, Issue 4; 8 pages (Apr. 2014).

ShareTechnote; "Electronics—PLL"; retreived from the Internet http://www.sharetechnote.com/html/Electronics_PLL.html ; 4 pages (Apr. 11, 2019).

Texas Instruments; "TPS53647 4-Phase, D-CAP+, Step-Down, Buck Controller with NVM and PMBus Interface for ASIC Power and High-Current Point-of-Load"; 123 pages (Feb. 2017).

Texas Instruments; "TPS543C20 4-V in, 40-A Stackable, Synchronous Step-Down SWIFT Converter with Adaptive Internal Compensation"; 47 pages (May 2018).

Texas Instruments, "TPS40140 Dual or 2-Phase Stackable Controller," TPS40140 Data Sheet, SLUS6601, Sep. 2005, Revised Jan. 2015; 71 pages.

U.S. Appl. No. 17/205,041, "Modular Interleaving Techniques for Scalable Power Electronics Converter," filed Mar. 18, 2021, 23 pages.

Notive of Allowance; U.S. Appl. No. 17/205,041; 8 pages (dated Feb. 17, 2022).

* cited by examiner

DISTRIBUTED INTERLEAVING CONTROL OF MULTIPHASE SMPCS

CROSS-REFERENCE TO RELATED APPLICATIONS

This application claims the priority under 35 U.S.C. § 119 of European patent application no. 19306559.6, filed Dec. 3, 2019 the contents of which are incorporated by reference herein.

FIELD

The present invention relates to distributed interleaving control of multiphase switched mode power converters (SMPC). It more particularly relates to multiphase SMPCs, SMPCs modules, and controllers therefor. It further relates to methods of controlling such SMPC modules and multiphase SMPCs.

BACKGROUND

Multiphase switched mode power converters (SMPCs) are becoming increasingly important for a range of applications. They are in particular useful for systems which need to be robust against component failure: since the power is provided by a plurality of subunits, a fault or failure in one sub-unit may be compensated by suitably adjusting the remaining subunits. Conventionally, control of such multiphase SMPCs is provided by a central controller. However, such a controller can represent a further point of vulnerability in the system or a single point of failure (SPOF), and so recently, attention has been turning towards methods of providing distributed control which tend to reduce or minimise such single point of failure vulnerability. One such method is discussed by Cousineau et al in U.S. Pat. No. 9,608,450. However, there remains a need for simple and robust distributed control.

SUMMARY

According to a first aspect of the present disclosure, there is provided a controller for a switched mode power converter module for use in a multiphase switched mode power converter, the controller comprising: a signal generator, configured to generate a periodic signal, having a frequency and a signal phase and for controlling the switched mode power converter module, wherein the signal generator is further configured to generate a clock signal having the frequency and the signal phase; a first-clock input configured to receive a first-clock signal having the frequency and a first phase from a first neighbouring controller; and a second-clock input configured to receive a second-clock signal having the frequency and a second phase from a second neighbouring controller; wherein the signal generator comprises a phase adjustment circuit configured to adjust the phase of the periodic signal so as to be equidistant from the first and second phase, wherein the phase adjustment circuit comprises an error circuit configured to determine an error signal in dependence on an offset between the phase and a mid-point between the first phase and the second phase, and a feedback circuit configured to adjust the phase in dependence on the error signal.

The single bit digital or binary signal, which makes up the clock signal and which communicates between neighbouring modules is less prone to noise than is the analogue signals associated with known distributed control methodologies. This may improve the robustness of the design to noise, and may also simplify implementation.

In one or more embodiments the error circuit comprises digital logic for determining the error signal from a difference between a first value proportional to a phase deference between the signal phase and the first phase, and a second value proportional to a phase deference between the signal phase and the second phase. Digital logic may be particularly straightforward to implement.

In one or more embodiments the clock signal has a 50% duty cycle. The digital logic may comprise an exclusive or, XOR, combination of the signal clock and the first-clock signal to determine the first value, and an exclusive or, XOR, combination of the signal clock and the second-clock signal to determine the second value. These logical operations may enable a very simple and efficient determination of the error signal with minimal signal processing.

In one or more embodiments, the controller may further comprise a first clock output and a second clock output configured to, during normal operation, transmit the signal clock to first and second neighbouring controllers respectively. These clock signals may be used by the respective first and second neighbouring controllers in order to determine the appropriate phrase for their own clocks.

In one or more embodiments, the switched mode power converter module comprises at least one switch, and the controller further comprises a control module configured to control the at least one switch in dependence on the periodic signal. Thus the controller may comprise an interleaver which is separate from the control module, or the interleaver may be integral with the control module.

In one or more embodiments, the controller may further comprise a status indicator indicative of a status of the controller, and the controller may be further configured to, in response to the status indicator indicating that the controller is disabled, transmit the first-clock signal from the second clock output and transmit the second-clock signal from the first clock output. Provision of a status indicator to indicate whether the controller is disabled—either intentionally or possibly because of a fault in the associated module—may assist in simplifying the control in such circumstances.

According to a second aspect of the present disclosure is there is provided a switched mode power converter module comprising a controller as described above, at least one switch, and an inductive element, wherein the at least one switch is configured to switchably supply current to the inductive element, under the control of the controller.

In one or more embodiments, the SMPC module may further comprise a switch driver circuit connected to an output of the controller and to the or each control input of the at least one switch and adapted to drive the at least one switch. The switch driver circuit may be provided separately to the controller, and since in general higher currents and powers are required for drivers than the controllers, this may simplify the manufacture of the controller. The control and switch driver circuit may be provided packaged as a multi-chip module, or may be provided in separate chips.

According to a further aspect the present disclosure there is provided a multiphase switched mode power converter, comprising at least three switched mode power converter modules each described above, wherein the respective controllers are arranged in a daisy-chain configuration, and the phases of the respective clock signals are equally distributed. A daisy-chain configuration may also be referred to as a circular-chain configuration.

In one or more embodiments, the multiphase SMPC may comprise at least one further switched mode power converter module, wherein, in response the controller of the at least one further switched mode power converter module being disabled, the phases of the other switched mode power converter modules are equally distributed. The further switched mode power converter module may be in addition to the at least three switched mode power converter modules, in which case the other switched mode power converter module are the at least three switched mode power converter; alternatively, the further switched mode power converter module may be one of the at least three switched mode power converter modules, in which case the other switched mode power converter module are the remainder of the at least three switched mode power converter modules.

In one or more embodiments, the multiphase SMPC may comprise at least 6 switched mode power converter modules each as described above, arranged in a plurality of sub-groups, wherein the respective controllers within each sub-group are arranged in a daisy-chain configuration, and the phases of the respective clock signals within each sub-group are equally distributed. Thus, instead of a single daisy-chain, a more complex architecture may be appropriate for some applications. The phase of the clock signal of a one of the controllers, or where controllers are arranged in subgroups, the phase of the clock signal of one of the controllers for each sub-group, may be fixed.

According to yet further aspect of the present disclosure, there is disclosed a method of controlling a switched mode power converter module for use in a multiphase switched mode power converter, the method comprising: generating a periodic signal, having a frequency and a signal phase and for controlling the switched mode power converter module; generating a clock signal having the frequency and the signal phase; receiving a first-clock signal having the frequency and a first phase from a first neighbouring controller; and receiving a second-clock signal having the frequency and a second phase from a second neighbouring controller; adjusting the phase of the periodic signal, by means of a phase adjustment circuit, so as to be equidistant from the first and second phase, wherein adjusting the phase of the periodic signal comprises determining an error signal in dependence on an offset between the phase and a mid-point between the first phase and the second phase, adjusting the phase in dependence on the error signal by means of a feedback circuit.

There may be provided a computer program, which when run on a computer, causes the computer to configure any apparatus, including a circuit, controller, sensor, filter, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software implementation may be an assembly program.

The computer program may be provided on a computer readable medium, which may be a physical computer readable medium, such as a disc or a memory device, or may be embodied as another non-transient signal.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
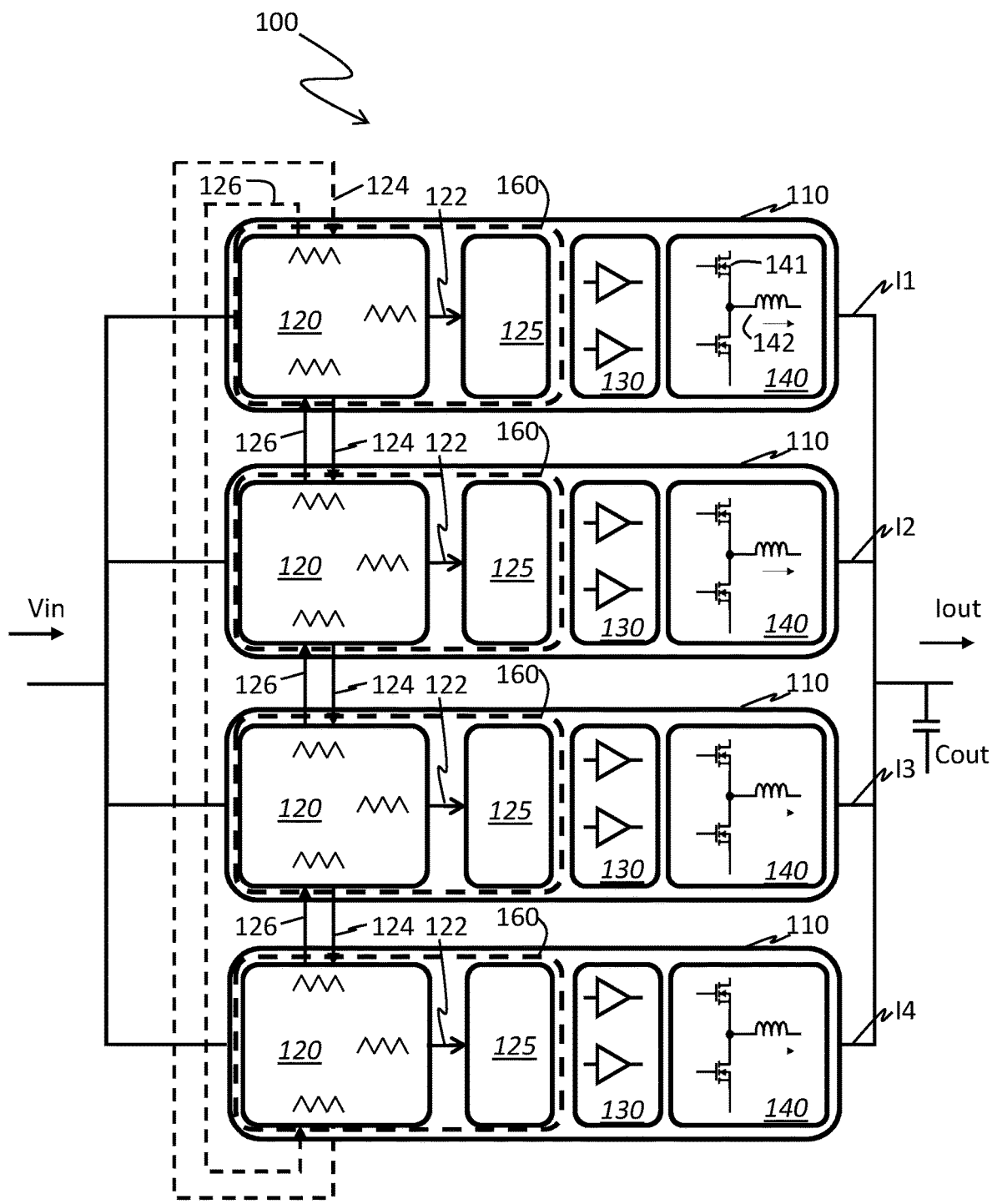
FIG. 1 shows a schematic diagram of the control arrangement for a multiphase switched mode power converter, have distributed control according to one or more embodiments.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments

DETAILED DESCRIPTION OF EMBODIMENTS

A multiphase SMPC 100 is shown in FIG. 1. The SMPC 100 comprises a plurality—in this case 4—SMPC modules 110. The modules are arranged in parallel—that is to say they are supplied by the same voltage supply Vin, and the current output I1, I2, I3 and I4 are connected in parallel to provide the output of the multiphase SMPC Iout, which is smoothed by means of output capacitor Cout. It is known that such a parallel arrangement of SMPC modules results in a low level of ripple, such that the size of the output capacitor Cout is significantly lower than is required for a single phase SMPC.

Each SMPC module comprises an interleaver 120, a control module 125, a switch driver circuit 130 and converter circuitry 140. The interleaver and control module 125 together form a controller 160. The converter circuitry 140 of each SMPC module may take one of several different architectures which will be familiar with to the skilled person. For example, the converter circuitry shown schematically in FIG. 1 for each SMPC module is a half bridge converter, in which a half bridge node is switched between a supply voltage and a ground voltage; connected to the half bridge node is an inductive element 142. The inductive element supplies an output current at a voltage which is between the supply voltage and the ground and depends on the mark-space ratio of the switching of the half-bridge. Equally, the converter circuitry may comprise a flyback converter or other topology. The switch driver circuit 130 may drive a single switch 141—for instance in the case of a flyback converter—or a plurality of switches 141—for instance, two switches are typically required in each SMPC module, in the case of a half bridge converter.

The interleaver 120 sends one or more control signals 122 to the control module 125. The control module may be a conventional SMPC controller, and provides output signals to the switch driver circuit 130. The form of these control signals depends on the topology of the converter circuitry. Since the present disclosure is not dependent on the particular form of topology of the converter circuitry 140, the particular form of the control signal or signals are thus not of particular significance to the present disclosure: the skilled person will be aware of the nature of the requirement on the control signals, depending on the specific topology.

However, for multiphase SMPC, the control signals from each of the different control modules 125 should have the same frequency, in order to minimise the output ripple on Iout, where Iout is the combination of the output currents from each of the SMPC modules. Moreover, in order to minimise the ripple, the modules should operate in an interleaved manner—that is to say the phases of the switching cycles of the respective modules should be equally spaced, in other words there is an equal phase shift between the modules. In the case of four modules, the switching cycles should, for minimum ripple on the output current Iout, be equally spaced apart in phase by $\lambda/2$—that is to say have relative phases of 0, $\pi/2$, $\pi$, and $3\pi/2$.

In a conventional multiphase SMPC this requirement is met by providing a centralised controller. The inventors of U.S. Pat. No. 9,608,450 describe an alternative arrangement, in which the control of each module is local to that module. In order to achieve this, each module controller generates its own triangular waveform, which is used for controlling that module. The controllers are arranged in a logical daisy-chain configuration, and each local controller transmits its own waveform to its nearest neighbours—that is to say, to the controller preceding it in the daisy-chain and the controller following it in the daisy-chain. The authors suggest that it is possible to use the triangular waveform from the two neighbouring controllers to adjust the phase of the local triangular waveform in order to ensure the phases of the respective modules are equally spaced. This is shown in FIG. 1 by communication links 124 and 126. The communication links 124 connect each local controller with its next neighbour, and allow the local controller to provide the analogue triangular waveform to the neighbouring controller in the daisy-chain. Communication links 126 connect the local controller with its previous neighbour, and allow the local controller to receive an analogue triangular waveform from its preceding neighbouring controller in the daisy-chain.

Figure 2:
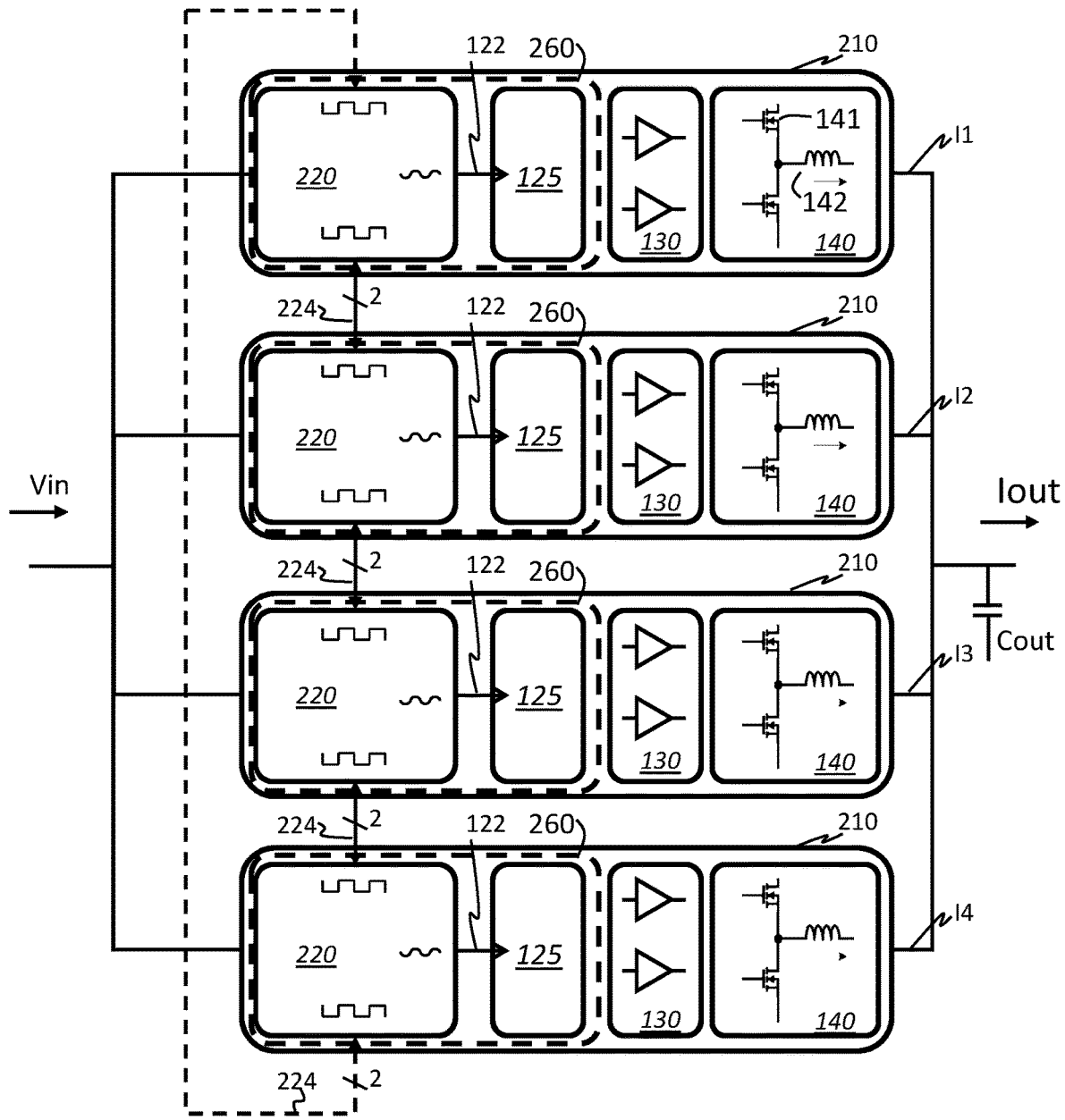
FIG. 2 depicts, schematically, a multiphase SMPC according to one or more embodiments.

FIG. 2 depicts, schematically, a multiphase SMPC according to one or more embodiments of the present disclosure. FIG. 2 is similar to the multiphase SMPC shown in FIG. 1 in that the multiphase SMPC the comprises a plurality (four, in this case) of SMPC modules 210, each of which comprise a switch driver circuit 130, converter circuitry 140. Each SMPC module also comprises a controller 260, which controller typically comprises an interleaver 220 and a control module 225. However, in this instance the interleavers 220 do not share analogue information with their neighbours. As will be discussed in more detail below, instead of transmitting an analogue signal, each local interleaver 220 transmits to its next and previous neighbour only a one-bit digital signal. As will become apparent, this one-bit digital signal, or binary signal, takes the form of a clock signal. The links between neighbouring local controllers are depicted in FIG. 2 as a two-wire link 224. One of these wires transmits the binary signal which is the clock status (either high or low) of the local controller to the controller preceding it in the daisy-chain; the other one of the wires transmits the binary signal which is the clock status (either high or low) of the preceding controller to the local controller.

Figure 3:
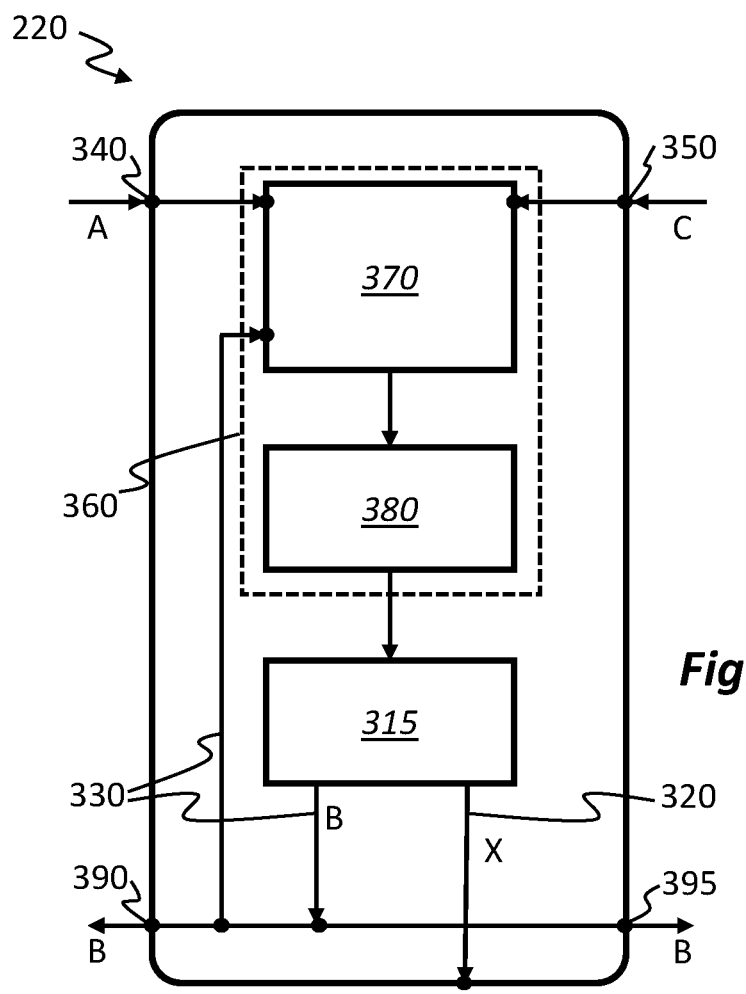
FIG. 3 shows, in schematic form, detail of parts of a controller 220 according to one or more embodiments.

FIG. 3 shows, in schematic form, detail of interleaver 220 according to one or more embodiments. The interleaver comprises a signal generator 315, which may comprise a voltage-controlled oscillator VCO 315. The signal generator 310 is configured to generate a periodic signal X 320, having a frequency and a signal phase. As will be discussed further below, the periodic signal X is used for controlling the switched mode power converter module. The signal generator is further configured to generate a clock signal, B 330. Clock signal 330 has the same frequency and phase as the periodic signal 320.

The interleaver 220 includes a first-clock input 340 configured to receive a first-clock A from a first neighbouring interleaver. The first neighbouring interleaver is the interleaver preceding the local interleaver in the daisy-chain. The first-clock signal has the same frequency as the periodic signal 320 and clock signal 330. The phase of the first clock signal will generally be different to that of the periodic signal 320 and clock signal B 330.

The interleaver 220 includes a second-clock input C 350 configured to receive a second-clock signal C from a second neighbouring interleaver. The second neighbouring controller is the interleaver following the local interleaver in the daisy-chain. The second-clock signal has the same frequency as the periodic signal 320 and clock signal 330. The phase of the second clock signal will generally be different to that of the periodic signal 320 and clock signal 330.

The interleaver 220 includes a first clock output 390 and a second clock output 395. The first clock output 390 is connected to the previous interleaver in the daisy-chain; the second clock output 395 is connected to the next interleaver in the daisy-chain. Both the first clock output 390 and the second clock output 395 output the clock signal B 330.

The signal generator comprises a phase adjustment circuit 360 configured to adjust the phase of the periodic signal so as to be equidistant from the first and second phase. The phase adjustment circuit 360 comprises an error circuit 370 configured to determine an error signal in dependence on an offset between the phase and a mid-point between the first phase and the second phase, and a feedback circuit 380 configured to adjust the phase in dependence on the error signal.

Figure 4:
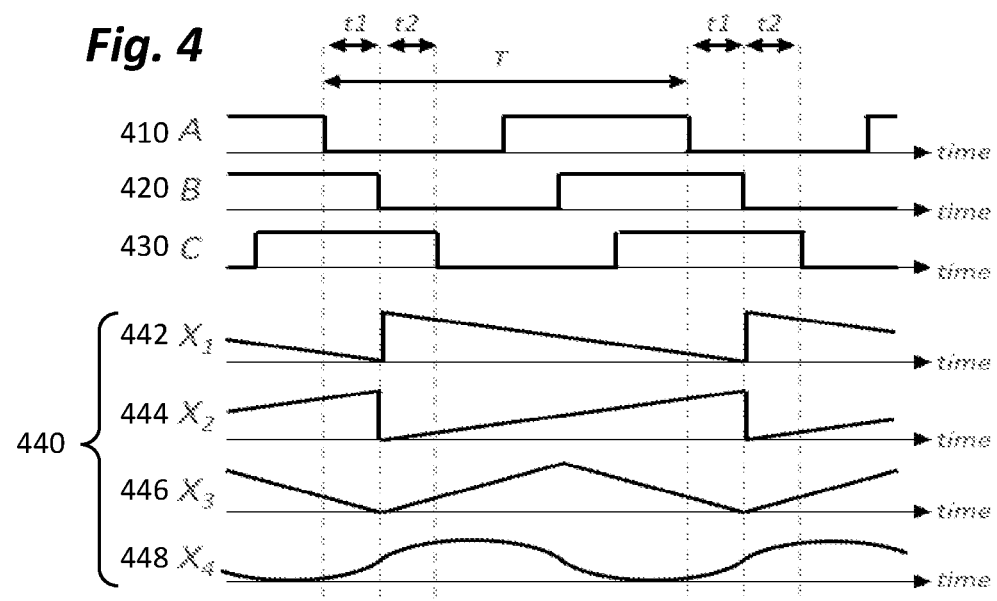
FIG. 4 shows the various waveforms associated with a controller.

FIG. 4 shows the various waveforms associated with controller 220. The top three waveforms correspond to 3 clock signals. Each of the clock signals has the same frequency, and thus the same period T. The middle waveform shows the clock signal B 420, which is generated by the local controller 220. The top waveform shows the first clock signal A 410 which is generated by the preceding controller in the daisy-chain and received at the first-clock input 340. The third waveform shows the second clock signal C 430, which is generated by the next controller in the daisy-chain and received at the second clock input 350.

In steady-state normal operation, the phase of the clock signal B generated by the local controller is midway between the phases of the first-clock and second-clock signals A and C, from the two neighbouring controllers in the daisy-chain, as shown in FIG. 4. That is to say the phase difference t1 between the first clock signal A and the local clock signal B 420 is equal to the phase difference t2 between the local clock signal B 420 and the second clock signal C The bottom four waveforms 440 depicted in FIG. 4 show four, nonlimiting, examples of the periodic signal X generated by the signal generator. These nonlimiting examples include a decreasing sawtooth X1 442, and increasing sawtooth X2 444, a symmetrical triangular waveform X3 446, and a sinusoid law waveform X4 448. The skilled person will appreciate that other waveforms are equally possible, including, for example a copy of the clock signal B 420. The periodic signals X have a period T, which corresponds to the cycle period of the SMPC module since SMP modules typically run at tens of kHz up to 10s of MHz, rather than 100s of MHz or GHz, the skilled person will appreciate that the clock signals, which also have a period T, are relatively 'slow' clocks, when compared with those typically used in communication and digital processing circuits.

The choice of the specific form of the waveform 420 depends on the topology of the SMPC module and the particular control scheme used to control the SMPC module. For instance, in one or more embodiments utilising conventional PWM control, a triangular waveform is particularly useful to easily determine appropriate switching moments for the SMPC module converter circuitry 140, since it allows the use of simple comparators in association with preset level thresholds to determining the appropriate switching moments. In other embodiments, such as those using the peak current detection or DPWM (digital pulse width modulation) other waveforms may be more appropriate; for instance some control methods only require correct alignment of a rising edge of the periodic signal.

As already mentioned, in steady-state normal operation, the phase of the clock signal B generated by the local controller is midway between the phases of the first-clock and second-clock signals A and C of the two neighbouring controllers in the daisy-chain. The phase adjustment circuit 360 determines an error signal by means of an error circuit 370, and a feedback circuit 380 is configured to adjust the phase in dependence on the error signal, tending to minimise the error signal until the phase is midway between the phases of neighbouring clock signals A and C. The feedback circuit may typically be configured as a feedback loop filter circuit.

Figure 5:
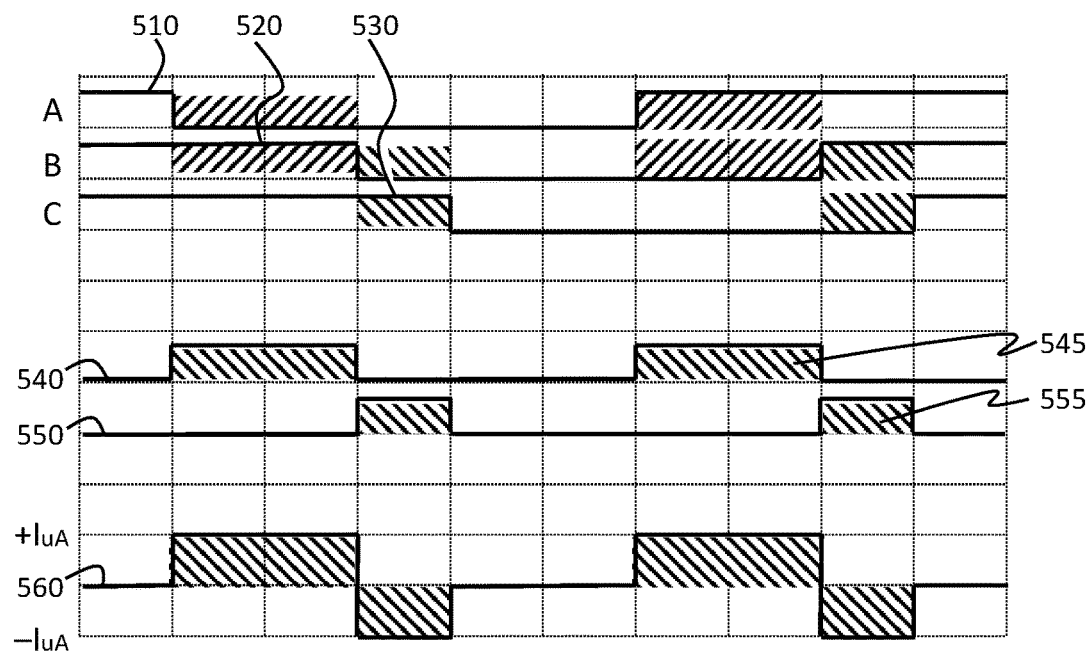
FIG. 5 illustrates the use of digital logic to determine an error signal.

In one or more embodiments, the error circuit comprises digital logic for determining the error signal from a difference between a first value proportional to a phase deference between the signal phase and the first phase, and a second value proportional to a phase deference between the signal phase and the second phase. The underlying principle of this type of error circuit is shown in FIG. 5: FIG. 5 shows, at the top, three waveforms 510, 520 and 530 being the phase of clock signals A, B and C respectively, in a situation in which clock signal B has a phase which is late relative to the midpoint between the phases of A and C.

The waveforms 540 and 550 show the result of an "XOR" digital logic between waveforms A and B, and B and C respectively. The resulting waveforms only have logic 'high' during the phase shift, which is a phase lag, between A and B, and B and C respectively. The area under the waveforms when these waveforms are 'high' is thus representative of the respective phase shifts (or phase lags. So, subtracting the waveform 550 from the waveform 540, results in a signal which, when integrated over an entire clock cycle T, is representative of the mismatch between the phase lags A to B, and B to C. This error signal can then be used to adjust the phase of B.

In summary:

$$Ierror \propto \frac{1}{T}\int_T (XOR(A, B) - XOR(B, C))dt,$$

where T is the length of the SMPC module switching cycle. As a result, the error signal average value is null only when both phase lags are equal.

It will be appreciated that, since only digital logic is used in order to generate the error signal, this is particularly straightforward to implement.

In one or more embodiments, the XOR logical operation can be replaced by other logical operator to have logic 'high' only during the phase shift between A and B, and B and C, around the clock rising edges or around the clock falling edges. This alternative may be useful when the clock signals duty cycles are not 50%, or when the clock edge is used as trigger. The person skilled in the art of multiphase SMPCs will appreciate that there are many ways to obtain proper interleaving of the clock signals by the rising edge or by the falling edge.

The error signal, which may be in the form of an error current Ierror as just described, is used to adjust the phase of the periodic signal, by means of a feedback circuit. In one or more embodiments, signals 540 and 550 drive a charge pump (controlled current source) to generate a current Is. The current Is goes through the loop filter circuit 380 to adjust the phase of B and X, such as is the case in a conventional phase lock loop (PLL).

Figure 6:
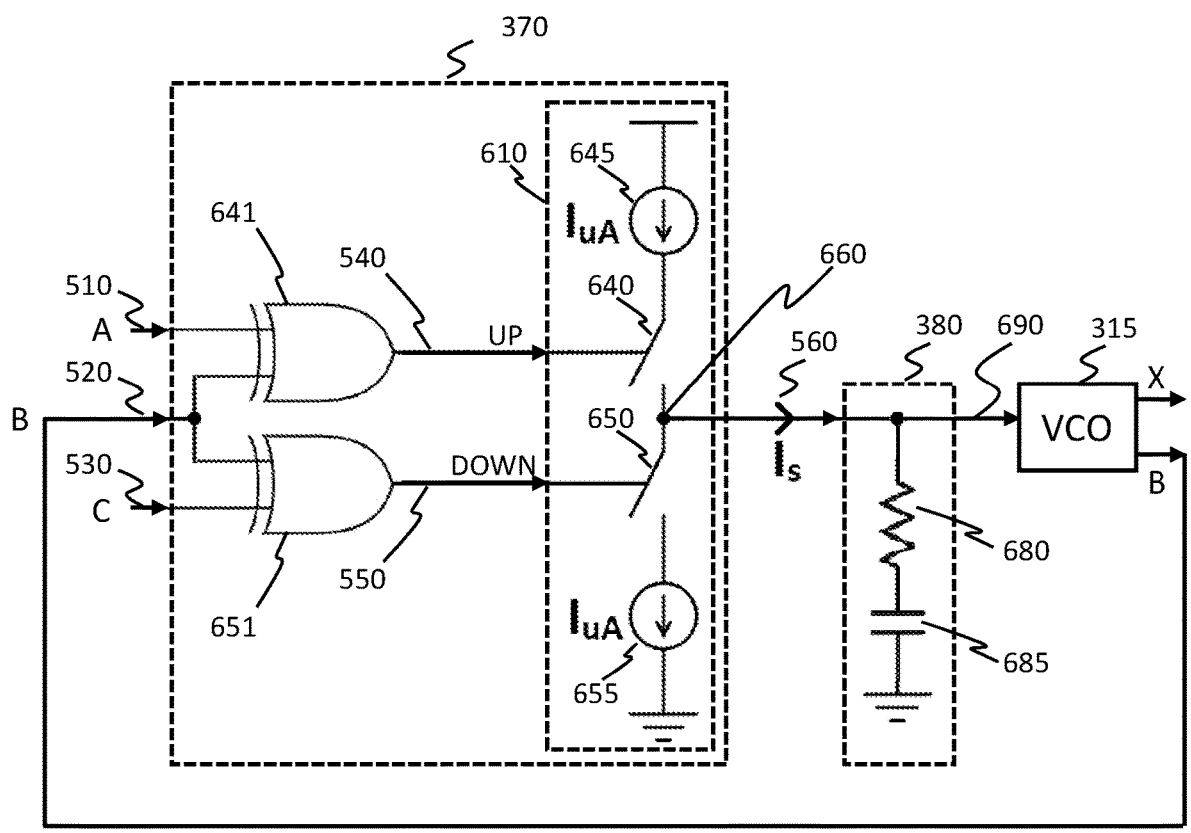
FIG. 6 signal shows an example of a feedback circuit which adjusts the phase of the periodic signal.

An example of such an implementation is shown in FIG. 6, which operates as follows:

A first XOR gate 641 generates a signal 540 from first-clock signal A and local controller clock signal B, 510 and 520 respectively. The signal 540 operates a switch 640 that connects a current source 645 to an output node 660. A second XOR gate 651 generates a signal 550 from local controller clock signal B and second-clock signal C, 520 and 530 respectively. The signal 550 operates a switch 650 that connects a second current source 655, which is equal in magnitude but opposite in polarity to current source 645, to the output node 660.

A loop filter circuit 380, according to one or more embodiments, is shown in schematic form. Current Is 560, output from the output node 660 flows to ground through the loop filter 380, which includes a resistor 680 and a capacitor 685. This loop filter 380 acts as a proportional-integral (PI) compensator. The resulting voltage is fed by the link 690 to correct the clock signal phase shift of the oscillator 315 that may be a Voltage Controlled Oscillator (VCO). The person skilled in the art of multiphase SMPCs will appreciate that there are many ways to implement the feedback loop filter, which need not be described herein.

It will be appreciated that the signal generator 310 may be considered to be a phase locked loop circuit. However, instead of a conventional phase locked loop circuit in which the phase of the generated signal is locked to the phase of a reference signal, with a fixed or known phase relationship between the reference signal and the generated signal, in embodiments according to the present disclosure, the phase is "locked" to the midpoint between the respective phases of two reference signals, the reference signals being the clocks of the two neighbours of the controller in the logical daisy-chain.

In order to be fault tolerant, a multiphase SMPC should be able to accommodate and adjust for a fault in one of the SMPC modules. The means for fault detection is not relevant to the present disclosure, however controllers disclosed herein according to one or more embodiments may be suitable to adjust for a fault. As already described, in normal operation the controllers for each of the local SMPC modules can optimise the phase between their respective clock signals, by interleaving the phases such that, for a multiphase SMPC having N SMPC modules, the phase difference between adjacent modules in the logical daisy-chain is $2\pi/N$. In the case of a fault being detected in one of the modules, the faulty module should be disabled, and the remaining modules should adjust the phase spacing such that the phase difference between each of the remaining (N−1) operational modules is $2\pi/(N-1)$. Furthermore, it may be desirable to disable one or more modules even if no fault is present. In particular, the conversion efficiency of SMPC modules generally decreases with decreased loading of the module below an optimum loading. For instance, if the load to be serviced by the SMPC is significantly reduced, the losses associated with operating all the modules at a relatively reduced loading may be high enough to make it desirable to disable one or more of the modules in order to increase the loading on the remaining modules. The person skilled in the art of multiphase SMPCs will appreciate that there are many ways to disable operation of a module, which need not be described herein.

However, in order for the remaining operating modules to operate properly with distributed control in such a situation, there should be a "passthrough" mechanism for the clock signals.

Figure 7:
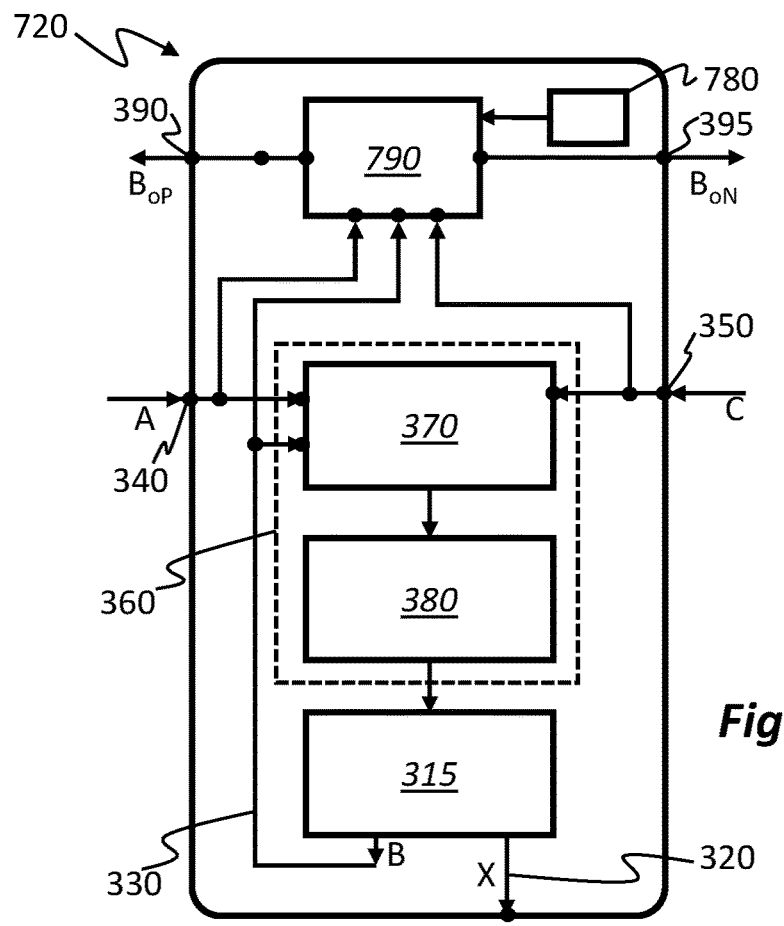
FIG. 7 shows detail of parts of a controller according to one or more embodiments enabling passthrough.

Such a passthrough mechanism is illustrated in FIG. 7. FIG. 7 shows detail of parts of a interleaver 720 according to one or more embodiments. The interleaver 720 is generally similar to the interleaver 220 shown in FIG. 2, except that the figure includes a status indicator 780 and a passthrough circuit 790. Status indicator 780 may, for instance, be stored as a flag in a memory within the controller, and in particular within the interleaver as shown, or may be provided by an external signal (not shown). The status indicator 780 indicates whether the SMPC module is disabled. The SMPC module is disabled typically in response to a fault being detected, such as a failed component. The fault detection circuitry may be part of the control module of the SMPC module, elsewhere in the controller of the SMPC module, or may be externally provided. Interleaver 720 includes a passthrough circuit 790. Passthrough circuit 790 is arranged to, in response to the status indicator indicating that the controller is disabled, transmit the first-clock signal A from the second clock output, instead of the clock signal B generated by the local module, and transmit the second-clock signal C from the first clock output, again instead of the clock signal B. The effect is to make the interleaver and associated controller appear transparent to the rest of the system. That is to say, the multiphase SMPC will operate as if, instead of having N SMPC modules, it only has N−1 modules, and the previous interleaver and controller is directly connected to the next interleaver and controller, thus shortening the daisy-chain and 'skipping' the faulty module's interleaver and controller.

Interleaver 720 achieves this passthrough operation by, instead of passing the locally generated clock signal B direct to the first output and second output, directing it to the passthrough circuit. The passthrough circuit operates as a multiplexer. Both of the first clock input 340 and the second clock input 350 are connected to the passthrough circuit. The status indicator is also connected to the passthrough circuit. In normal operation, that is to say when the status indicator does not indicate that the controller comprising the interleaver is disabled, both the first clock output 390 and the second clock output 395 output the clock signal B 330. However, in the case of a fault in the module or other condition under which the status indicator indicates that the controller comprising the interleaver is disabled, passthrough circuit connects the first clock input 340 to the second clock output 395, and the second clock input 350 to the first clock output 390.

The skilled person will appreciate that, in view of the daisy-chain arrangement of the controllers in the modules of the multiphase SMPC, it is possible that the phase adjustment circuits of interleavers in the controllers might not converge to a stable operating condition: rather the phases of the modules may start to 'chase' each other. In order to prevent this, it may be desirable in one or more embodiments to fix the phase of the clock of one of the controllers. In such embodiments it may be appropriate to include a further communication link between the controllers (not shown), in order to share information as to which of the controllers is acting as the fixed controller. This information may be used such that if the fixed controller is faulty or otherwise set to disabled, one of the other controllers may take over the role of fixed controller.

Figure 8:
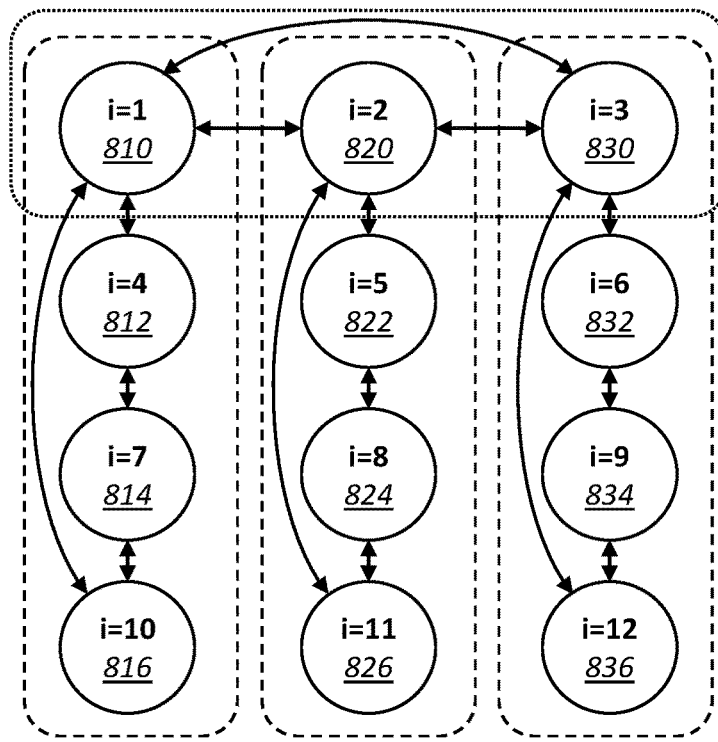
FIG. 8 shows a logical topology of a multiphase SMPC have several groups of SMPC modules.

The embodiments described above have, in common, an arrangement in which the controllers of the modules of multiphase SMPC are logically connected in a single daisy-chain configuration, and the modules themselves are connected in parallel, that is to say, the current outputs from the modules are combined into a single current output. However, the present disclosure extends to other configurations. One such logical topology is shown in FIG. 8 and includes three modules 810, 820 and 830 arranged as a primary group having their controllers arranged in a logical daisy-chain. Each of these three modules is further arranged with a further three modules to form a secondary group, each secondary group having thereby in total four modules and having their controllers arranged in a separate logical daisy-chains. Thus modules 810, 812, 814 and 816 form a first secondary group, modules 820 822, 824 and 826 form a second secondary group, and finally modules 830, 832, 834 and 836 form a third secondary group.

As shown, the phases of the primary group are interleaved. So, assuming the phase of module 810 is at 0, the phases for the 12 modules will be as follows:

810—0; 820—2π/3; 830—4π/3;
812—π/2; 822—7π/6; 832—11π/6;
814—π; 824—5π/3; 834—π/3;
816—3π/2; 826—π/6; 836—5π/6.

In this example, the modules themselves may still be arranged in parallel that it is to say the output current $I_i$ (where i=1 to 12) from each of the 12 modules are combined to provide a single output $I_{OUT}$. Alternatively, and without limitation, the output current $I_i$ of modules belonging to the same secondary groups may be arranged in parallel, but the outputs from the group may not be combined, that it is to say there would in this instance, be three separate outputs: I1 (from I=1, 4, 7 and 10), I2, (from i=2, 5, 8 and 11), and I3 from (i=3, 6, 9 and 12), Alternatively, since the phases of the secondary groups are equally spaced, a different phase relationship may be determined for the primary group—for instance they may be all set to have the same phase (0), instead of being interleaved. A series-parallel arrangement may be more appropriate for the application, such that the output currents $I_1$, $I_4$, $I_7$ and $I_{10}$ from the first secondary group are arranged in parallel, as are the output currents $I_2$, $I_5$, $I_8$ and $I_{11}$ from the second secondary group, and the output currents $I_3$, $I_6$, $I_9$ and $I_{12}$ from the third secondary group. The phases of each module may then be as follows:

810—0; 820—0; 830—0;
812—π/2; 822—π/2; 832—π/2;
814—π; 824—π; 834—π;
816—3π/2; 826—3π/2; 836—3π/2.

Finally, and again without limitation, the embodiments above have been discussed with respect to so-called parallel multiphase SMPCs. However, the present disclosure extends to so-called multilevel, multiphase SMPCs. Various such topologies exist such as Modular Multilevel Converter (MMC) SMPCs, Flying Capacitor (FC) SMPCs, etc which are typically used for high power applications in the kW to MW scale.

Multilevel SMPCs cascades in series a given number of SMPCs that supply current to an inductive element, under the control of the controller. These cascaded SMPCs in the multilevel converter may use proper interleaving, as disclosed above, to reduce the current ripple fed to the inductive element.

Thus, in one or more embodiments the controllers, including the interleavers, or the SMPC modules of multilevel SMPC are logically connected in a single daisy-chain configuration, whilst the SMPC's converter circuitry themselves are cascaded. The skilled person will appreciate that such a parallel arrangement of multilevel converters results in a low level of ripple, such that the size of the output capacitor Cout is significantly lower than is required for a single multilevel converter.

For instance, the secondary groups shown in FIG. 8 may correspond to a multilevel converter wherein each module corresponds to a SMPC. The current output of these multilevel converters may be connected in parallel to provide output Iout, such as described above. Such a parallel arrangement of multilevel converters results in a low level of ripple, such that the size of the output capacitor Cout may be significantly smaller than is required for a single multilevel converter. In this case, the primary groups are typically interleaved.

Three-phase alternating current (AC) electric power systems require converters with three outputs, where each output is connected to an AC phase. The number of outputs can be extended to the number of AC phases used. In one or more embodiments each of the secondary groups shown in FIG. 8 may correspond to a multiphase SMPC, multilevel SMPC or multilevel-multiphase SMPC that is connected to an AC phase. In this type of application, the primary group may be all set to have the same phase to reduce current ripple, or the size of the output filtering elements.

The disclosure further extends to a signal interleaving unit comprising a signal generator, configured to generate a periodic signal, having a frequency and a signal phase, wherein the signal generator is configured to generate a clock signal having the frequency and the signal phase; a first-clock input configured to receive a first-clock signal having the frequency and a first phase from a first neighbouring controller; and a second-clock input configured to receive a second-clock signal having the frequency and a second phase from a second neighbouring controller; wherein the signal generator comprises a phase adjustment circuit configured to adjust the phase of the periodic signal so as to be equidistant from the first and second phase, wherein the phase adjustment circuit comprises an error circuit configured to determine an error signal in dependence on an offset between the phase and a mid-point between the first phase and the second phase, and a feedback circuit configured to adjust the phase in dependence on the error signal. In other words, the signal interleaving unit includes some of the functionality of the controllers disclosed in other embodiments and discussed above, but need not actually from the switched mode power converter module.

In one or more embodiments the error circuit comprises digital logic for determining the error signal from a difference between a first value proportional to a phase deference between the signal phase and the first phase, and a second value proportional to a phase deference between the signal phase and the second phase.

From reading the present disclosure, other variations and modifications will be apparent to the skilled person. Such variations and modifications may involve equivalent and other features which are already known in the art of multiphase switch mode power converters and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims] and reference signs in the claims shall not be construed as limiting the scope of the claims.

The invention claimed is:

1. A controller for a switched mode power converter module for use in a multiphase switched mode power converter, the controller comprising:
   a signal generator, configured to generate a periodic signal, having a frequency and a signal phase and for controlling the switched mode power converter module, wherein the signal generator is further configured to generate a clock signal having the frequency and the signal phase;
   a first-clock input configured to receive a first-clock signal having the frequency and a first phase from a first neighbouring controller; and
   a second-clock input configured to receive a second-clock signal having the frequency and a second phase from a second neighbouring controller;
   wherein the signal generator comprises a phase adjustment circuit configured to adjust the phase of the periodic signal so as to be equidistant from the first and second phase,
   wherein the phase adjustment circuit comprises an error circuit configured to determine an error signal in dependence on an offset between the phase and a mid-point between the first phase and the second phase, and a feedback circuit configured to adjust the phase in dependence on the error signal.

2. A controller as claimed in claim 1, wherein the error circuit comprises digital logic for determining the error signal from a difference between a first value proportional to a phase deference between the signal phase and the first phase, and a second value proportional to a phase deference between the signal phase and the second phase.

3. A controller as claimed in claim 1, wherein the clock signal has a 50% duty cycle.

4. A controller as claimed in claim 2, wherein the digital logic comprises an exclusive or, XOR, combination of the signal clock and the first-clock signal to determine the first value, and an exclusive or, XOR, combination of the signal clock and the second-clock signal to determine the second value.

5. A controller as claimed in claim 1, further comprising a first clock output and a second clock output configured to, during normal operation, transmit the signal clock to first and second neighbouring controllers respectively.

6. A controller as claimed in claim 1, wherein the switched mode power converter module comprises at least one switch, the controller further comprising a control module, configured to control the at least one switch in dependence on the periodic signal.

7. A controller as claimed in claim 1, further comprising a status indicator indicative of a status of the controller, and wherein the controller is further configured to, in response to the status indicator indicating that the controller is disabled, transmit the first-clock signal from the second clock output and transmit the second-clock signal from the first clock output.

8. A switched mode power converter module comprising, at least one switch, an inductive element, and a controller, the controller comprising:
 a signal generator, configured to generate a periodic signal having a frequency and a signal phase and for controlling the switched mode power converter module, wherein the signal generator is further configured to generate a dock signal having the frequency and the signal phase;
 a first-clock input configured to receive a first-clock signal having the frequency and a first phase from a first neighbouring controller; and
 a second-dock input configured to receive a second-clock signal having the frequency and a second phase from a second neighbouring controller;
 wherein the signal generator comprises a phase adjustment circuit configured to adjust the phase of the periodic signal so as to be equidistant from the first and second phase,
 wherein the phase adjustment circuit comprises an error circuit configured to determine an error signal in dependence on an offset between the phase and a mid-point between the first phase and the second phase, and a feedback circuit configured to adjust the phase in dependence on the error signal;
 wherein the switch is configured to switchably supply current to the inductive element, under the control of the controller.

9. A switched mode power converter module as claimed in claim 8, further comprising a switch driver circuit connected to an output of the controller and to the control input of each of the at least one switch and adapted to drive the at least one switch.

10. A multiphase switched mode power converter, comprising at least three switched mode power converter modules each as claimed in claim 8, wherein the respective controllers are arranged in a daisy-chain configuration, and the phases of the respective clock signals are equally distributed.

11. A multiphase switched mode power converter as claimed in claim 10, comprising at least one further switched mode power converter, wherein, in response the controller of the at least one further switched mode power converter module being disabled, the phases of the other switched mode power converter modules are equally distributed.

12. A multiphase switched mode power converter comprising at least 6 switched mode power converter modules each as claimed in claim 10, arranged in a plurality of sub-groups, wherein the respective controllers within each sub-group are arranged in a daisychain configuration, and the phases of the respective clock signals within each sub-group are equally distributed.

13. A multiphase switched mode power converter as claimed in claim 10 wherein the phase of the clock signal of a one of the controllers within that sub-group is fixed.

14. A multiphase switched mode power converter as claimed in claim 12 wherein, for each sub-group, the phase of the clock signal of a one of the controllers within that sub-group is fixed.

15. A method of control ling a switched mode power converter, SMPC, module for use in a multiphase SMPC, the method comprising:
 generating a periodic signal, having a frequency and a signal phase and for controlling the switched mode power converter module;
 generating a clock signal having the frequency and the signal phase;
 receiving a first-clock signal having the frequency and a first phase from a first neighbouring controller, wherein the first neighbouring controller is a controller of a further SMPC module of the multiphase SMPC; and
 receiving a second-clock signal having the frequency and a second phase from a second neighbouring controller, wherein the first neighbouring controller is a controller of a further SMPC module of the multiphase SMPC;
 adjusting the phase of the periodic signal, by means of a phase adjustment circuit, so as to be equidistant front the first and second phase,
 wherein adjusting the phase of the periodic signal comprises determining an error signal in dependence on an offset between the phase and a mid-point between the first phase and the second phase, and adjusting the phase in dependence on the error signal by means of a feedback circuit.

16. A signal interleaving unit comprising a signal generator, configured to generate a periodic signal, having a frequency and a signal phase and for controlling a switched mode power converter module, wherein the signal generator is configured to generate a clock signal having the frequency and the signal phase,
 a first-clock input configured to receive a first-clock signal having the frequency and a first phase from a first neighbouring controller; and
 a second-clock input configured to receive a second-clock signal having the frequency and a second phase from a second neighbouring controller;
 wherein the signal generator comprises a phase adjustment circuit configured to adjust the phase of the periodic signal so as to be equidistant from the first and second phase,
 wherein the phase adjustment circuit comprises an error circuit configured to determine an error signal in dependence on an offset between the phase and a mid-point between the first phase and the second phase, and a feedback circuit configured to adjust the phase in dependence on the error signal.

17. A signal interleaving unit as claimed in claim 16, wherein the error circuit comprises digital logic for determining the error signal from a difference between a first value proportional to a phase deference between the signal phase and the first phase, and a second value proportional to a phase deference between the signal phase and the second phase.

* * * * *